United States Patent
Suchoff

(10) Patent No.: US 10,067,168 B2
(45) Date of Patent: Sep. 4, 2018

(54) MODULAR POWER METERING SYSTEM

(71) Applicant: RARITAN AMERICAS, INC., Somerset, NJ (US)

(72) Inventor: Michael Suchoff, Chapel Hill, NC (US)

(73) Assignee: Raritan Inc., Somerset, NJ (US)

( * ) Notice: Subject to any disclaimer, the term of this patent is extended or adjusted under 35 U.S.C. 154(b) by 311 days.

(21) Appl. No.: 15/140,076

(22) Filed: Apr. 27, 2016

(65) Prior Publication Data

US 2016/0313382 A1   Oct. 27, 2016

Related U.S. Application Data

(60) Provisional application No. 62/153,235, filed on Apr. 27, 2015.

(51) Int. Cl.
*G01R 21/133* (2006.01)
*G01R 21/06* (2006.01)

(52) U.S. Cl.
CPC ............ *G01R 21/133* (2013.01); *G01R 21/06* (2013.01)

(58) Field of Classification Search
None
See application file for complete search history.

(56) References Cited

U.S. PATENT DOCUMENTS

| | | | |
|---|---|---|---|
| 7,072,779 B2 | 7/2006 | Hancock et al. | |
| 7,493,222 B2 | 2/2009 | Bruno | |
| 8,421,639 B2 | 4/2013 | Bitsch et al. | |
| 2003/0105608 A1 | 6/2003 | Hart | |
| 2003/0212473 A1* | 11/2003 | Vandevanter | G06F 1/12 700/293 |
| 2008/0169947 A1* | 7/2008 | Harper | H03M 9/00 341/101 |
| 2010/0235122 A1* | 9/2010 | McCrea | G01R 21/06 702/64 |
| 2012/0271570 A1* | 10/2012 | Paik | G01D 4/004 702/57 |
| 2014/0028282 A1 | 1/2014 | Perry et al. | |
| 2014/0218882 A1* | 8/2014 | Sandberg | G01R 1/04 361/760 |

OTHER PUBLICATIONS

International Search Report and Written Opinion, dated Jul. 27, 2016, Authorized Officer—Blaine R. Copenheaver; International Application No. PCT/US2016/029542; Applicant: Raritan Americas, Inc.

* cited by examiner

*Primary Examiner* — Charles Garber
*Assistant Examiner* — Alia Sabur
(74) *Attorney, Agent, or Firm* — Vorys, Sater, Seymour and Pease LLP; Vincent M DeLuca

(57) ABSTRACT

A power meter includes a voltage sensor input port configured to receive one of single phase AC voltage and three phase AC voltage values. The power meter further includes a current sensor input port configured to receive one of single phase AC current and three phase AC current values. The power meter further includes a bus connector adapted to be coupled to a data bus. The power meter further includes a module connector adapted to be coupled to a module bus. The power meter further includes a timer for producing a digitizing clock. The power meter further includes a microprocessor.

14 Claims, 6 Drawing Sheets

MODULAR POWER METERING SYSTEM

CROSS-REFERENCE TO RELATED APPLICATION

This application claims priority from U.S. Patent Application No. 62/153,235 filed on Apr. 27, 2015, which is incorporated by reference herein in its entirety.

FIELD OF DISCLOSURE

The present disclosure relates to the field of power management and in particular to power metering.

BACKGROUND

Data centers including multiple computer server racks arranged into multiple rows incorporate power distribution solutions for delivering power to the computer servers. Electrical Panelboards, for example, are commonly used in data centers for delivering power to the multiple rows of computer server racks which constitute branch circuits. A Panelboard may be either wired to a floor power distribution unit ("PDU") serving an entire row or wired to a bus bar above the row, for example. A monitoring system such as Schneider Electric's PowerLogic Branch Circuit Power Meter, is commonly used to monitor the Panelboard and provide information relating to the current, voltage, and power load on each branch circuit associated with a Panelboard.

Existing branch circuit power meters, however, are not flexible and therefore are not easily expansible. For example, during installation of a data center, a branch circuit monitor may be configured to monitor a number of branch circuits associated with a Panelboard. A data center may expand over time, however, which may require additional Panelboards. It may be expensive and inefficient to install and calibrate additional monitoring circuits that meet the industry defined Revenue Grade Metering standard.

SUMMARY

In one embodiment, a power meter includes a voltage sensor input port configured to receive one of single phase AC voltage and three phase AC voltage values. The power meter further includes a current sensor input port configured to receive one of single phase AC current and three phase AC current values. The power meter further includes a bus connector adapted to be coupled to a data bus. The power meter further includes a module connector adapted to be coupled to a module bus. The power meter further includes a timer for producing a digitizing clock. The power meter further includes a microprocessor. The microprocessor is configured to phase lock the digitizing, clock to a multiple frequency of AC voltage frequency. The microprocessor is further configured to digitize received voltage values and received current values using the digitizing clock. The microprocessor is further configured to calculate timing data based on the frequency and the phase of the digitized voltage values. The microprocessor is further configured to calculate power based on the digitized voltage, the digitized current, and the timing data. The microprocessor is further configured to communicate the calculated power via the bus connector. The microprocessor is further configured to serialize the digitized voltage and the timing data. The microprocessor is further configured to output the serialized digitized voltage and the timing data via the module connector.

In one embodiment, a power meter includes a voltage sensor input port configured to receive one of single phase AC voltage and three phase AC voltage values. The power meter further includes a current sensor input port configured to receive one of single phase AC current and three phase AC current values. The power meter further includes a bus connector adapted to be coupled to a data and redundant power bus. The power meter further includes a module connector adapted to be coupled to a module bus. The power meter further includes an AC to DC power supply coupled to the bus connector. The power meter further includes a timer to produce a digitizing clock. The power meter further includes a microprocessor. The microprocessor is configured to phase lock the digitizing clock to a multiple frequency of AC voltage frequency. The microprocessor is further configured to digitize received voltage values and received current values using the digitizing clock. The microprocessor is further configured to calculate timing data based on the frequency and the phase of the digitized voltage values. The microprocessor is further configured to calculate power quality based on the digitized voltage, the digitized current, and the timing data. The microprocessor is further configured to communicate the calculated energy via the bus connector. The microprocessor is further configured to serialize the digitized voltage and the timing data. The microprocessor is further configured to output the serialized digitized voltage and the timing data via the module connector. The microprocessor is configured to be redundantly powered by one of the AC to DC power supply and the bus connector.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
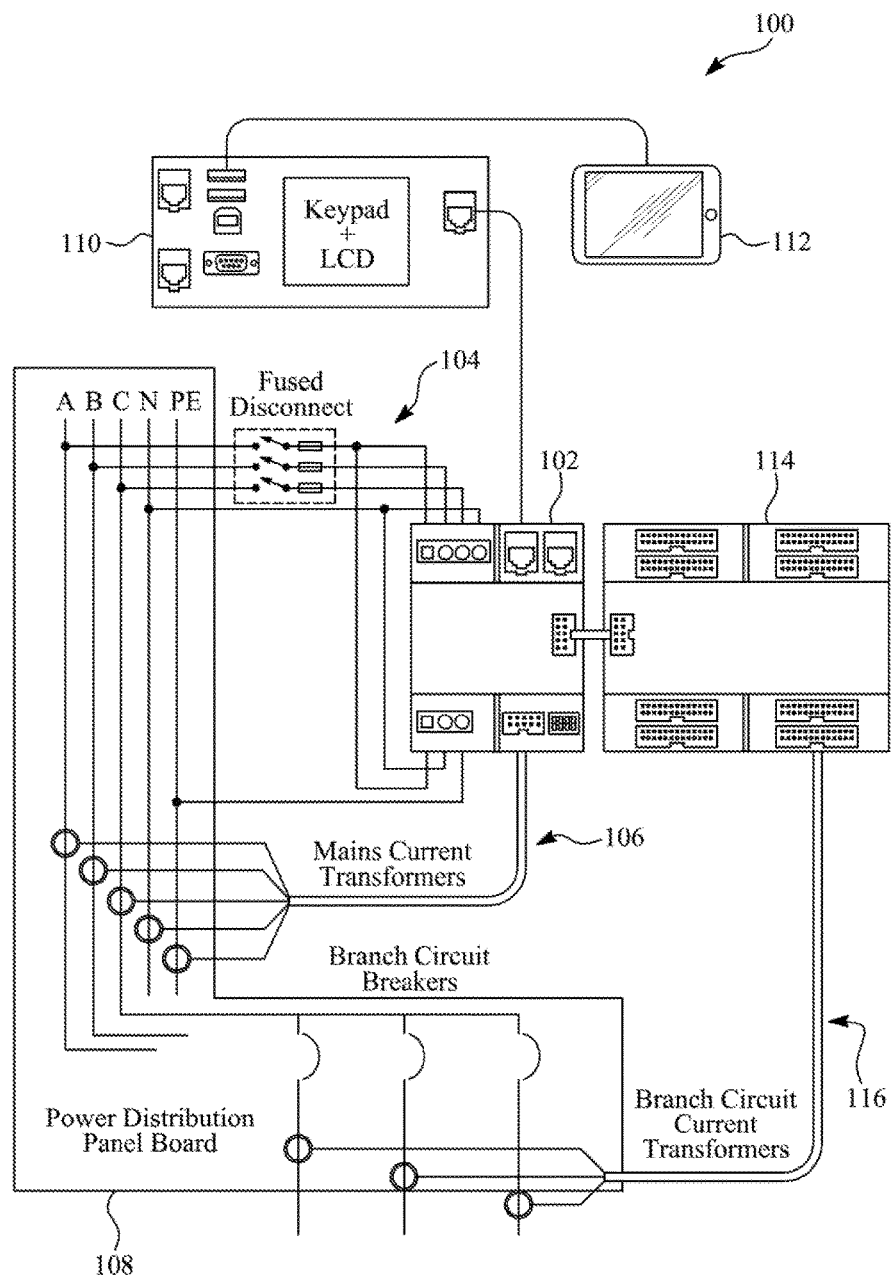
FIG. 1 illustrates an example modular power metering system.

FIG. 1 illustrates an example modular power metering system 100. System 100 includes a power meter module 102 that monitors voltage 104 and current 106 received from a power distribution panel board 108. In one example, the power meter module 102 is a 3-phase power meter. The power meter module 102 calculates a power value which is then displayed by a controller 110. In particular, the power meter module 102 digitizes the voltage and the current received from the power meter module 102, calculates timing data based on the frequency and phase of the digitized voltage value, and calculates the power based on the digitized voltage, the digitized current, and the timing data. The power meter module 102 communicates the calculated power to a data bus through a bus connector from where it can be read by the controller 110.

The controller 110 is configured to communicate and interact with a user via a user interface such as a display and keyboard for example. In particular, the controller 110 reads calculated power from the data bus and displays the calculated power on a display for a user to read. The user interface may also enable user to provide information to the modular power metering, system 100 such as power meter module 102 settings. The controller 110 may then configure the power meter module 102 according to the received settings. The controller 110 may further be configured to communicate and interact with a computing device 112 via USB, or another suitable interface.

The power meter module 102 also serializes the digitized voltage and the timing data and communicates the serialized digitized voltage and timing data to a branch circuit meter 114 via a module connector. The branch circuit meter 114 monitors branch circuit current 116 of the power distribution panel board 108. The branch circuit meter 114 digitizes the branch circuit current and calculates branch circuit power based on the received digitized voltage, the received timing data, and the digitized branch circuit current. The branch circuit meter 114 then communicates the calculated branch circuit power to the data bus where it can be read by the controller 110.

Figure 2A:
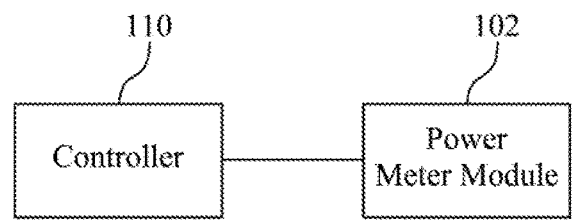
FIG. 2A illustrates an example modular power metering system.

It should be appreciated that, although the example modular power metering system 100 is illustrated to include a single power meter module 102 and a single branch circuit meter 114, the modular power metering system 100 may be configured to include a single power meter module 102 with no branch circuit meter, as illustrated in FIG. 2A.

Figure 2B:
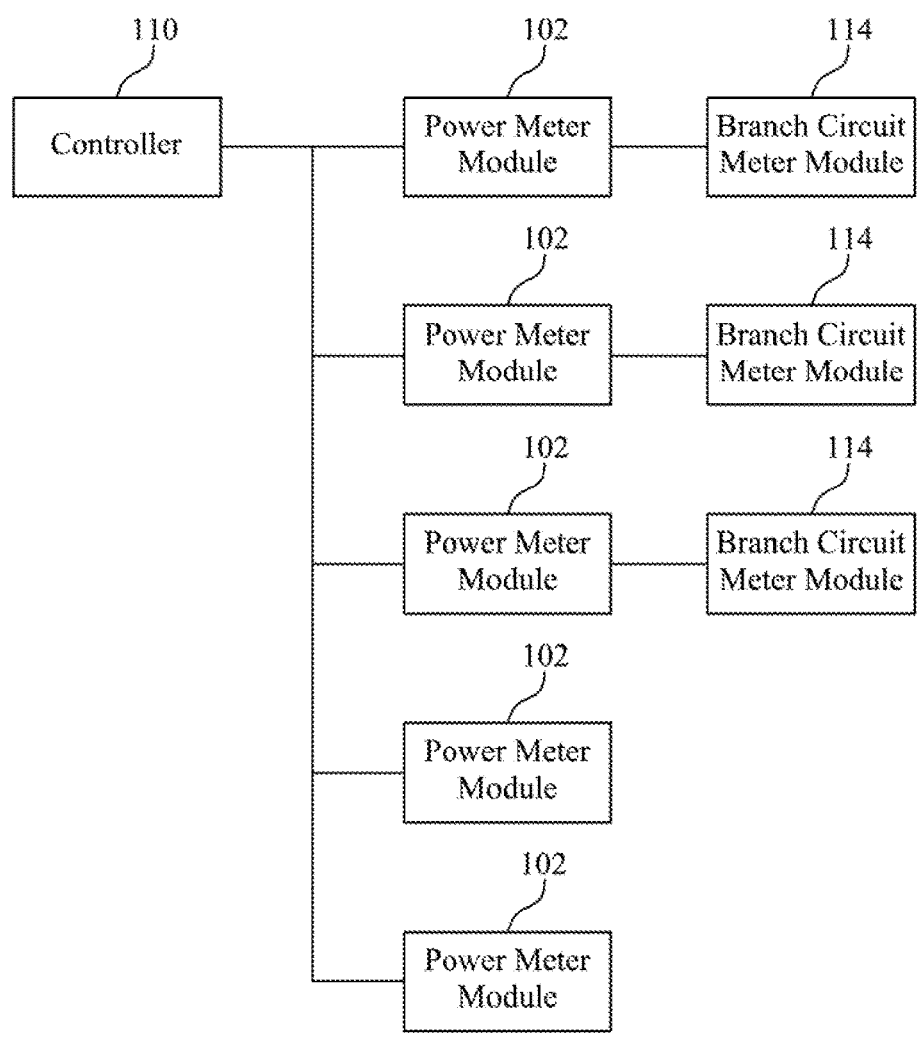
FIG. 2B illustrates an example modular power metering system.

In addition, the modular power metering system 100 can be expanded or reconfigured as power monitoring needs change to include additional suitable number of power meter modules 102 and branch circuit meters 114, as illustrated in FIG. 2B. For example, a number of power meter modules 102 may be daisy chained and interconnected via respective bus connectors. The daisy chained power meter modules 102 may or may not be coupled to branch circuit meters 114, depending on the power monitoring needs.

In one example, the power meter module 102 includes an AC to DC power supply. The power supply is connected to the bus connector and provides redundant power via the data bus. For example, a microprocessor of the power meter module 102 may be configured to redundantly receive power from either the AC to DC power supply or from the data bus. Thus, in an example in which multiple power meter modules 102 are daisy chained together, the AC to DC power supplies of the respective power meter modules 102 all provide redundant power to the data bus. Thus, all of the power meter modules 102 in the daisy chain may remain powered and operational as long as one of the AC to DC power supplies of the multiple power meter modules 102 are functioning. Branch circuit meters 114 receive power from power meter modules 102 via respective module connectors. Therefore, the branch circuit meters 114 are also redundantly powered via respective module connectors by either the AC to DC power supplies of the power meter modules which they are connected to or from the data bus.

Figure 3:
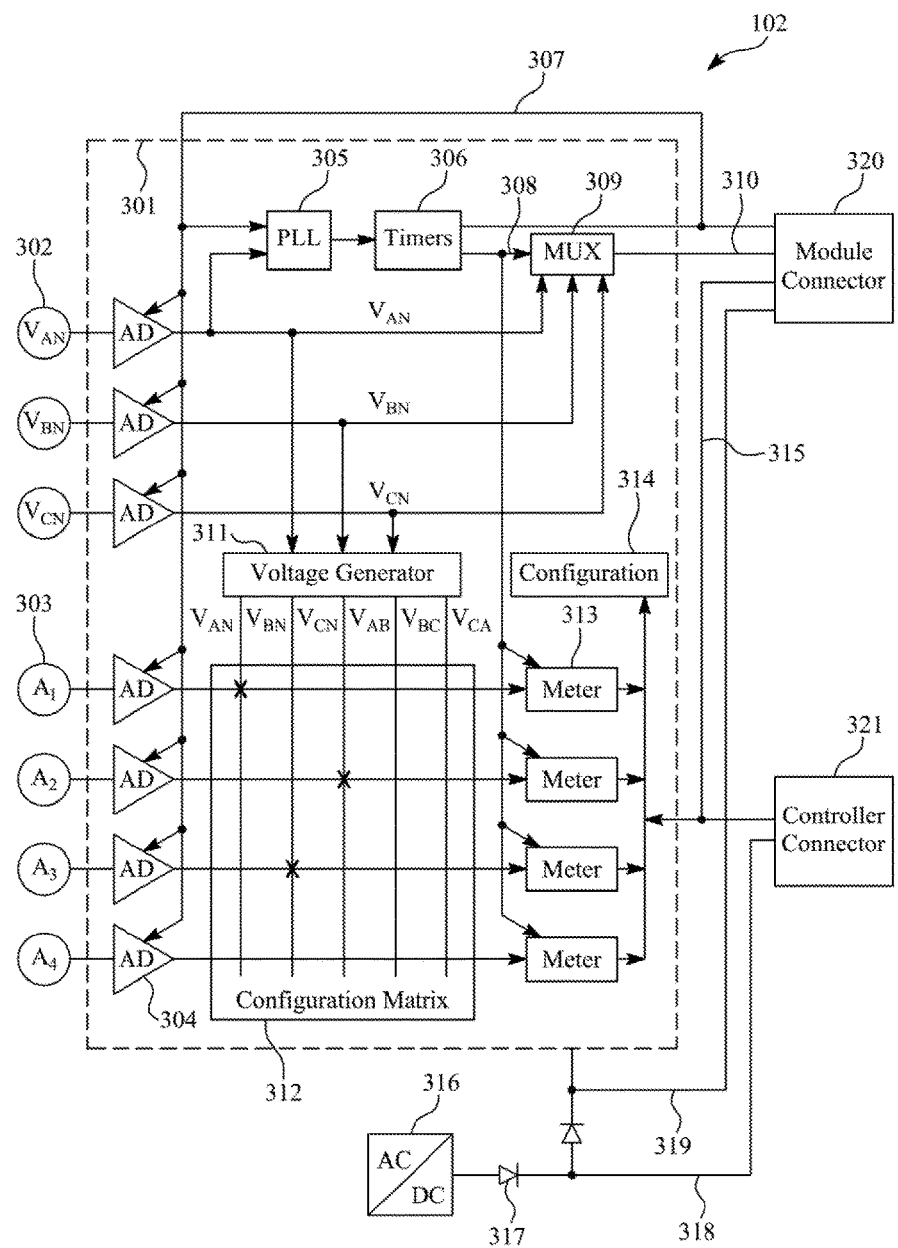
FIG. 3 illustrates an example power meter module of FIG. 1.

FIG. 3 illustrates an example power meter module 102 of FIG. 1. The power meter module 102 includes three AC voltage sensors 302. The AC voltage sensors 302 are configured to receive or measure the voltages of a three-phase AC circuit. The power meter module 102 further includes a current sensor 303 configured to receive or measure the current of an AC circuit. In one example, as illustrated, the power meter module 102 includes 4 current sensors 303.

The power meter module 102 further includes a module connector 320 that is configured to couple to a module bus. A branch circuit meter 114 can be plugged into the module connector 320 to expand the number of current channels to be monitored. The power meter module 102 further includes a controller connector or bus connector 321 for connecting to a controller 110 via a data bus.

The power meter module 102 further includes a microprocessor 301. In one example, the microprocessor 301 is a Texas Instruments MSP430. The microprocessor 310 is configured to phase lock a digitizing clock to a multiple frequency of AC voltage frequency. The microprocessor 310 is further configured to digitize received voltage values and received current values using a digitizing clock. The microprocessor 310 is further configured to calculate timing data based on the frequency and the phase of the digitized voltage values. The microprocessor 310 is further configured to calculate power based on the digitized voltage, the digitized current, and the timing data. The microprocessor 310 is further configured to communicate the calculated power via a bus connector. The microprocessor 310 is further configured to serialize the digitized voltage and the timing data. The microprocessor 310 is further configured to output the serialized digitized voltage and the timing data via the module connector 320.

The microprocessor 301 includes seven analog to digital converters 304 for producing three digitized voltage signals and 4 digitized current signals. The microprocessor 301 further includes timers 306 to produce a digitizing clock 307. The digitizing clock 307 is an exact frequency multiple of the AC voltage and is used to trigger conversions of the analog to digital converters 304. The timers 306 also produce timing signals 308, including AC voltage zero crossing and measurement averaging timing signals for calculating power and other measurements.

The microprocessor 301 further includes a phase lock loop 305 to compare the digitized voltage frequency and phase to the digitizing clock 307 and to adjust the timers 306 so the digitizing clock 307 is an exact multiple of the AC voltage frequency.

The microprocessor 301 further includes a multiplexer 309 that combines three digitized voltages and timing signals into a sample packet transmitted over a voltage sample communication line 310. The voltage sample communication line 310 is wired to the module connector 320 so that the voltage samples and the timing signals can be used by a branch circuit meter 114. A packet is produced each time the digitizing clock 307 triggers an analog to digital conversion.

The microprocessor 301 further includes a voltage generator 311 that calculates phase to phase voltages from phase to neutral voltages. Phase to phase voltages are necessary to compute power measurements when a current sensor 303 is connected to a phase to phase circuit.

The microprocessor 301 further includes a configuration matrix 312 that routes voltages and currents to each power meter 313. There is a separate power meter 312 corresponding to each current sensor 303.

The microprocessor 302 further includes configuration logic 314 configured to set up the configuration matrix 312 and other internal microprocessor 302 attributes. The configuration logic 314 is read and written to over the controller communication line 315, which allows meter measurements and other configuration settings to be exchanged between the controller 110, the power meter module 102, and the branch circuit meter 114.

In one example, the power meter module 102 further includes an AC to DC power supply 316 for, along with diodes 317, redundantly powering the power meter module 102, the branch circuit meter 114, and controller 110. The redundant power line 318 is wired to the controller connector 321 and provides power to the controller 110. If more than one power meter module 102 is wired to the controller 110, then the entire network of the controller 110 and power meter modules 102 is redundantly powered and all continue to function as long as at least one of the multiple AC to DC power supplies 316 remains functional. A module power line 319 provides power for the power meter module 102 and the branch circuit meter 114.

Figure 4:
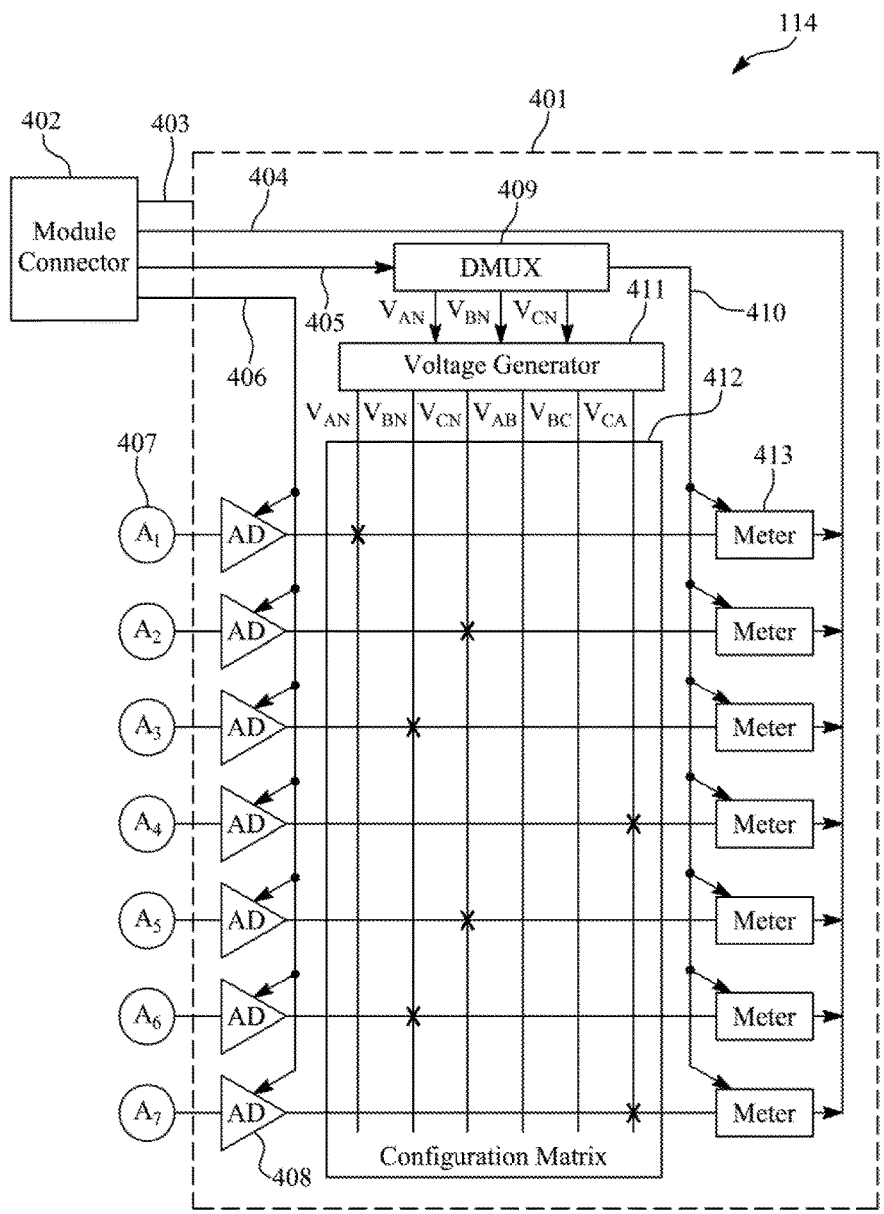
FIG. 4 illustrates an example branch circuit meter of FIG. 1.

FIG. 4 illustrates an example branch circuit meter 114 of FIG. 1. The branch circuit meter 114 includes a module connector 403 for connecting the branch circuit meter 114 to the power meter module 102. The branch circuit meter 114 receives module power 403 via the module connector 402. The branch circuit meter 114 communicates meter measurements to the controller 110 on a controller communication line 404 via the module connector 402. The branch circuit meter 114 also receives multiplexed digitized voltages and timing signals from the power meter module 102 on a voltage sample communication line 405. The branch circuit meter 114 also receives the digitizing clock line 406 from the power meter module 102 via the module connector 402. The digitizing clock line 406 is used to trigger conversions of the analog to digital converters.

The branch circuit meter 114 further includes a branch circuit AC current sensor or input port 407 for receiving current. In one example, the branch circuit meter 114 includes seven branch circuit AC current sensor or input ports 407. The current sensors 407 may be coupled to any combination of phase to neutral or phase to phase circuits.

The branch circuit meter 114 further includes a branch circuit microprocessor 401. In one example, the branch circuit microprocessor 401 is a Texas Instruments MSP430. The branch circuit microprocessor 401 is configured to receive serialized digitized voltage and timing data via the module connector 402. The branch circuit microprocessor 401 is further configured to digitize received branch circuit current values using, a digitizing clock. The branch circuit microprocessor 401 is further configured to calculate branch circuit power based on the digitized voltage, the digitized branch circuit current, and the timing data. The branch circuit microprocessor 401 is further configured to communicate the calculated branch circuit power to a data bus via the module connector 401.

The branch circuit microprocessor 401 includes an analog to digital converter 408 that produces a digitized current signal. In one example, the branch circuit microprocessor 401 includes seven analog to digital converters 408. The branch circuit microprocessor 401 further includes a de-multiplexer 409 that splits the single received on the voltage sample communication line 405 into three digitized voltages and timing signals 410. The timing signals 410 are used by power meters 413 to calculate power and other measurements. In one example, branch circuit microprocessor 401 includes a separate power meters 413 corresponding to each current sensor 407. The branch circuit microprocessor 401 further includes a voltage generator 411. The voltage generator calculates the phase to phase voltages from the phase to neutral voltages. Phase to phase voltages are necessary to compute power measurements when a current sensor 407 is connected to a phase to phase circuit. The branch circuit microprocessor 401 further includes a configuration matrix 412. The configuration matrix 412 routes voltages and current to each power meter 413.

Figure 5:
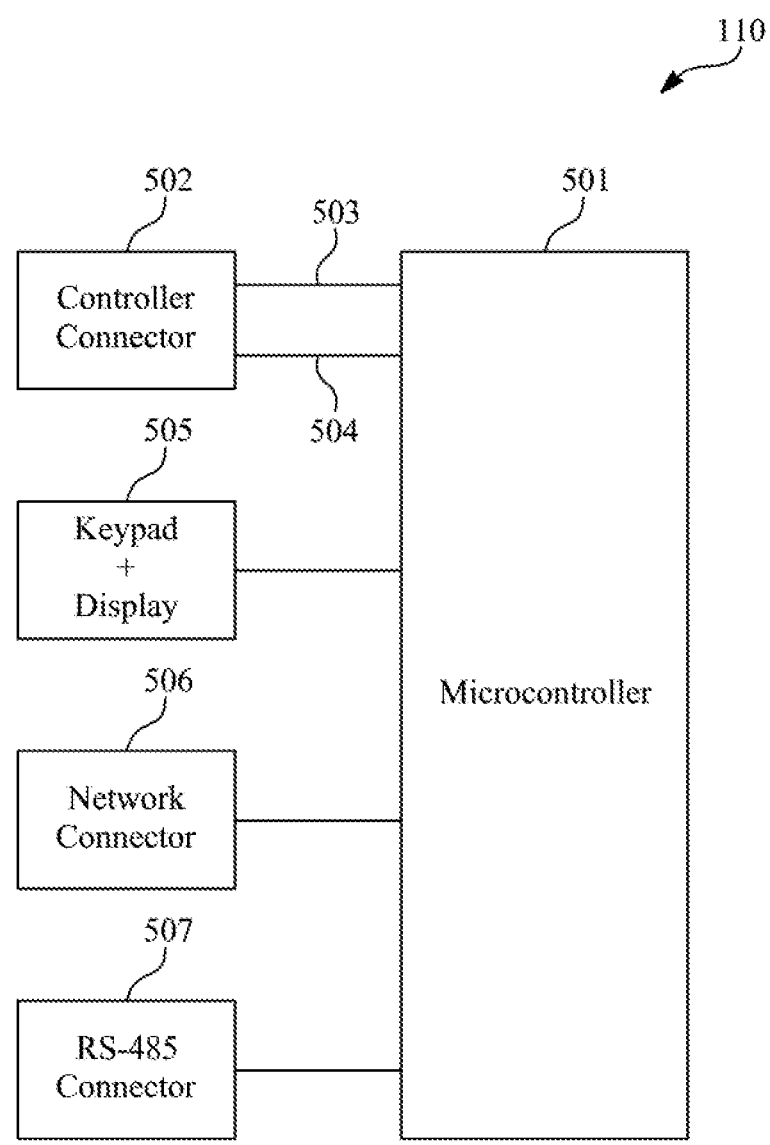
FIG. 5 illustrates an example controller of FIG. 1.

FIG. 5 illustrates an example controller 110 of FIG. 1. The controller 110 includes a communication controller microprocessor 501. In one example, the communication controller microprocessor 501 is an embedded Linux ARM controller. The communication controller microprocessor 501 is configured to receive module power 503 from the power meter module 102 via a bus connector or controller connector 502. The communication controller microprocessor 501 is also configured to receive power meter measurements and to configure power meter modules 102 and branch circuit meters 114 over a controller communication line 504 via the controller connector 502.

The controller 110 further includes a user interface 505 including a keypad and display. The user interface 505 enables a user to select and view measurements as well as to provide configuration parameters to the system 100. The controller 110 further includes a network connector 506 for coupling the controller 110 to an Ethernet LAN. The controller 110 further includes an RS-484 connector 507. In one example, the RS-484 connector 507 couples the controller 110 to an RS-485 network such as MODBUS or BACNET. It should be appreciated that the controller 110 may include other suitable interfaces such as USB ports for coupling the controller 110 to other computing devices such as a smartphone or a tablet computer.

Figure 6:
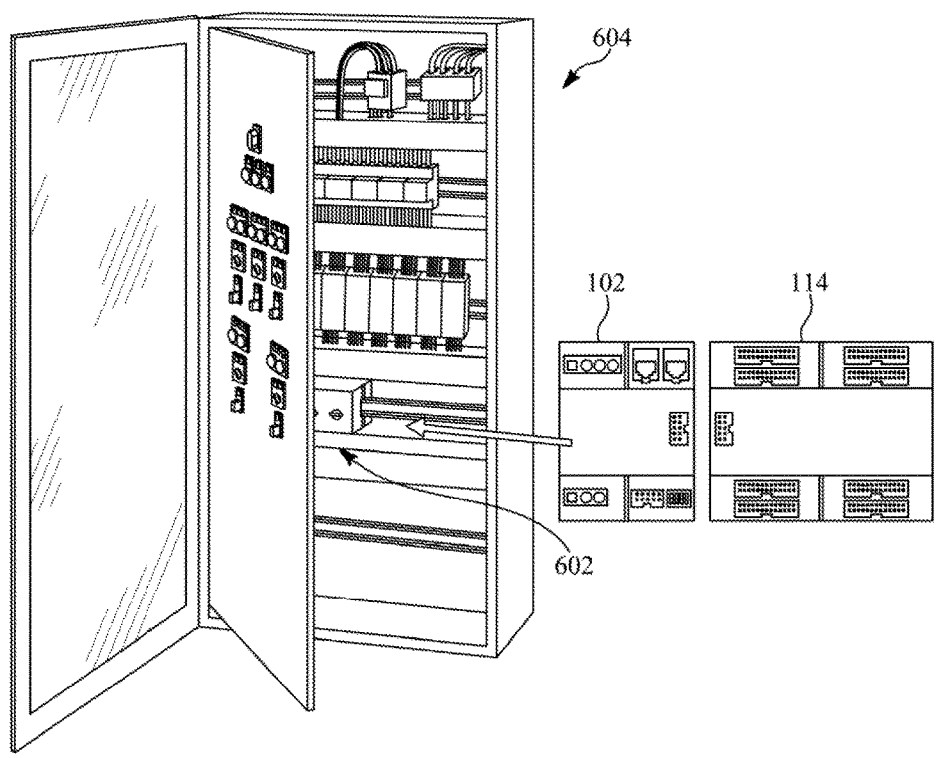
FIG. 6 illustrates an example modular power metering system.

In one example, as illustrated in FIG. 6, the power meter module 102 and the branch circuit meter 114 may be packaged as DIN rail modules 602 for installation in a DIN rail panel board 604.

While example systems, methods, and so on, have been illustrated by describing examples, and while the examples have been described in considerable detail, it is not the intention to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, and illustrative examples shown or described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Gamer, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

The invention claimed is:

1. A power meter comprising:
a voltage sensor input port configured to receive one of single phase AC voltage and three phase AC voltage values;
a current sensor input port configured to receive one of single phase AC current and three phase AC current values;
a bus connector adapted to be coupled to a data bus;
a module connector adapted to be coupled to a module bus;
a timer for producing a digitizing clock; and
a microprocessor configured to:
phase lock the digitizing clock, to a multiple frequency of AC voltage frequency;
digitize received voltage values and received current values using the digitizing clock;
calculate timing data based on the frequency and the phase of the digitized voltage values;
calculate power based on the digitized voltage, the digitized current, and the timing data;
communicate the calculated power via the bus connector;
serialize the digitized voltage and the timing data; and
output the serialized digitized voltage and the timing data via the module connector.

2. The power meter of claim 1, wherein the power meter is further adapted to be coupled to a plurality of additional power meters, wherein power meter and the plurality of additional power meters are daisy chained via bus connectors of the power meter and the bus connectors of the plurality of additional power meters.

3. The power meter of claim 1, further comprising an AC to DC power supply, wherein the AC to DC power supply is coupled to the bus connector to provide power via the data bus, wherein the microprocessor is configured to redundantly receive power from one of the AC to DC power supply and the bus connector.

4. The power meter of claim 3:
wherein the power meter is further adapted to be coupled to a plurality of additional power meters, wherein power meter and the plurality of additional power meters are daisy chained via bus connectors of the power meter and the bus connectors of the plurality of additional power meters; and
wherein the power meter and the plurality of additional power meters are redundantly powered via the bus connectors of the power meter and the bus connectors of the additional plurality of power meters, and wherein the power meter and the plurality of additional power meters are configured to remain powered while at least one of the AC to DC power supplies of the power meter and the plurality of additional power meters are functioning.

5. The power meter of claim 1, wherein the module connector is further adapted to be coupled to a branch circuit meter via the module bus, wherein the branch circuit meter comprises:
a branch circuit module connector adapted to be coupled to the module connector;
a plurality of branch circuit current sensor input ports configured to receive branch circuit currents; and
a branch circuit microprocessor configured to:
receive the serialized digitized voltage and the timing data via the module connector,
digitize received branch circuit current values using the digitizing clock;
calculate branch circuit power based on the digitized voltage, the digitized branch circuit current, and the timing data; and
communicate the calculated branch circuit power to the data bus via the module connector.

6. The power meter of claim 5, wherein the power meter is further adapted to be coupled to a plurality of additional power meters, wherein power meter and the plurality of additional power meters are daisy chained via bus connectors of the power meter and the bus connectors of the plurality of additional power meters.

7. The power meter of claim 5, further comprising, an AC to DC power supply, wherein the AC to DC power supply is coupled to the bus connector to provide power via the data bus, wherein the microprocessor is configured to redundantly receive power from one of the AC to DC power supply and the bus connector, and wherein the branch circuit meter is configured to redundantly receive power via the module connector from one of the AC to DC power supply and the bus connector.

8. The power meter of claim 5:
wherein the power meter is further adapted to be coupled to a plurality of additional power meters, wherein power meter and the plurality of additional power meters are daisy chained via bus connectors of the power meter and the bus connectors of the plurality of additional power meters; and
wherein the power meter and the plurality of additional power meters are redundantly powered via the bus connectors of the power meter and the bus connectors of the additional plurality of power meters, and wherein the power meter and the plurality of additional power meters are configured to remain powered while at least one of the AC to DC power supplies of the power meter and the plurality of additional power meters are functioning.

9. The power meter of claim 1, adapted to be coupled to a communication controller, the communication controller comprising:
a bus connector adapted to be coupled to the power meter, wherein the communication controller is redundantly powered via the bus connector;
a data port configured to provide a data interface for communicating with a computing device;
a user interface comprising a display and a keypad;
a communication controller microprocessor configured to:
receive calculated power via the bus connector;
communicate the calculated power to the user interface responsive to receiving a request from the user interface; and
configure the power meter via the bus connector responsive to receiving a request to configure the power meter from one of the user interface and the data port.

10. A power meter comprising:
a voltage sensor input port configured to receive one of single phase AC voltage and three phase AC voltage values;

a current sensor input port configured to receive one of single phase AC current and three phase AC current values;
a bus connector adapted to be coupled to a data and redundant power bus;
a module connector adapted to be coupled to a module bus;
an AC to DC power supply coupled to the bus connector;
a timer to produce a digitizing clock; and
a microprocessor configured to:
  phase lock the digitizing clock to a multiple frequency of AC voltage frequency;
  digitize received voltage values and received, current values using the digitizing clock;
  calculate timing data based on the frequency and the phase of the digitized voltage values;
  calculate power quality based on the digitized voltage, the digitized current, and the timing data;
  communicate the calculated energy via the bus connector;
  serialize the digitized voltage and the timing data; and
  output the serialized digitized voltage and the timing data via the module connector;
  wherein the microprocessor is configured to be redundantly powered by one of the AC to DC power supply and the bus connector.

11. The power meter of claim 10:
wherein the power meter is further adapted to be coupled to a plurality of additional power meters, wherein power meter and the plurality of additional power meters are daisy chained via bus connectors of the power meter and the bus connectors of the plurality of additional power meters; and
wherein the power meter and the plurality of additional power meters are redundantly powered via the bus connectors of the power meter and the bus connectors of the additional plurality of power meters, and wherein the power meter and the plurality of additional power meters are configured to remain powered while at least one of the AC to DC power supplies of the power meter and the plurality of additional power meters are functioning.

12. The power meter of claim 10, wherein the module connector is further adapted to be coupled to a branch circuit meter via the module bus, wherein the branch circuit meter comprises:
a branch circuit module connector adapted to be coupled to the module connector;
a plurality of branch circuit current sensor input ports configured to receive branch circuit currents; and
a branch circuit microprocessor configured to:
  receive the serialized digitized voltage and the timing data via the module connector,
  digitize received branch circuit current values using the digitizing clock;
  calculate branch circuit power based on the digitized voltage, the digitized branch circuit current, and the timing data; and
  communicate the calculated branch circuit power to the data bus via the module connector;
  wherein the branch circuit meter is configured to redundantly receive power via the module connector from one of the AC to DC power supply and the bus connector.

13. The power meter of claim 12:
wherein the power meter is further adapted to be coupled to a plurality of additional power meters, wherein power meter and the plurality of additional power meters are daisy chained via bus connectors of the power meter and the bus connectors of the plurality of additional power meters; and
wherein the power meter and the plurality of additional power meters are redundantly powered via the bus connectors of the power meter and the bus connectors of the additional plurality of power meters, and wherein the power meter and the plurality of additional power meters are configured to remain powered while at least one of the AC to DC power supplies of the power meter and the plurality of additional power meters are functioning.

14. The power meter of claim 13, adapted to be coupled to a communication controller, the communication controller comprising:
a bus connector adapted to be coupled to the power meter, wherein the communication controller is redundantly powered via the bus connector;
a data port configured to provide a data interface for communicating with a computing device;
a user interface comprising a display and a keypad;
a communication controller microprocessor configured to:
  receive calculated power via the bus connector;
  communicate the calculated power to the user interface responsive to receiving a request from the user interface; and
  configure the power meter via the bus connector responsive to receiving a request to configure the power meter from one of the user interface and the data port.

* * * * *